(12) United States Patent
Zwieback et al.

(10) Patent No.: US 9,388,509 B2
(45) Date of Patent: Jul. 12, 2016

(54) METHOD FOR SYNTHESIZING ULTRAHIGH-PURITY SILICON CARBIDE

(71) Applicant: II-VI Incorporated, Saxonburg, PA (US)

(72) Inventors: Ilya Zwieback, Township of Washington, NJ (US); Avinash K. Gupta, Basking Ridge, NJ (US); Ping Wu, Warren, NJ (US); Donovan L. Barrett, Port Orange, FL (US); Gary E. Ruland, Morris Plains, NJ (US); Thomas E. Anderson, Morristown, NJ (US)

(73) Assignee: II-VI Incorporated, Saxonburg, PA (US)

( * ) Notice: Subject to any disclaimer, the term of this patent is extended or adjusted under 35 U.S.C. 154(b) by 260 days.

(21) Appl. No.: 13/951,808

(22) Filed: Jul. 26, 2013

(65) Prior Publication Data

US 2013/0309496 A1    Nov. 21, 2013

Related U.S. Application Data

(63) Continuation-in-part of application No. 12/096,306, filed as application No. PCT/US2006/046673 on Dec. 7, 2006, now abandoned.

(60) Provisional application No. 60/748,347, filed on Dec. 7, 2005.

(51) Int. Cl.
  *C30B 28/10* (2006.01)
  *C30B 29/36* (2006.01)
  *C30B 28/12* (2006.01)

(52) U.S. Cl.
  CPC ............ *C30B 28/12* (2013.01); *C30B 29/36* (2013.01); *Y10T 428/2982* (2015.01)

(58) Field of Classification Search
  None
  See application file for complete search history.

(56) References Cited

U.S. PATENT DOCUMENTS

| 492,767 A | 2/1893 | Acheson |
| 615,648 A | 12/1898 | Acheson |

(Continued)

FOREIGN PATENT DOCUMENTS

| JP | 06298515 A | * 10/1994 |
| JP | 08298117 A |   11/1996 |

OTHER PUBLICATIONS

Biltoft et al., Chapter 3: Review of Basic Vacuum Calculations, Fall 2002.

(Continued)

*Primary Examiner* — Guinever S Gregorio
(74) *Attorney, Agent, or Firm* — The Webb Law Firm

(57) ABSTRACT

In a method of forming polycrystalline SiC grain material, low-density, gas-permeable and vapor-permeable bulk carbon is positioned at a first location inside of a graphite crucible and a mixture of elemental silicon and elemental carbon is positioned at a second location inside of the graphite crucible. Thereafter, the mixture and the bulk carbon are heated to a first temperature below the melting point of the elemental Si to remove adsorbed gas, moisture and/or volatiles from the mixture and the bulk carbon. Next, the mixture and the bulk carbon are heated to a second temperature that causes the elemental Si and the elemental C to react forming as-synthesized SiC inside of the crucible. The as-synthesized SiC and the bulk carbon are then heated in a way to cause the as-synthesized SiC to sublime and produce vapors that migrate into, condense on and react with the bulk carbon forming polycrystalline SiC material.

17 Claims, 5 Drawing Sheets

(56) References Cited

U.S. PATENT DOCUMENTS

| | | | |
|---|---|---|---|
| 1,804,361 A | | 5/1931 | Marcin |
| 3,385,723 A | | 5/1968 | Pickar |
| 4,467,043 A | * | 8/1984 | Kriegesmann et al. ......... 501/88 |
| 5,268,336 A | | 12/1993 | Deleeuw et al. |
| 5,683,507 A | | 11/1997 | Barrett et al. |
| 5,704,985 A | | 1/1998 | Kordina et al. |
| 5,863,325 A | | 1/1999 | Kanemoto et al. |
| 5,985,024 A | | 11/1999 | Balakrishna et al. |
| 6,056,820 A | | 5/2000 | Balakrishna et al. |
| 6,554,897 B2 | | 4/2003 | Golan |
| 6,783,747 B1 | | 8/2004 | Sudo et al. |
| 2004/0149993 A1 | | 8/2004 | McClure et al. |
| 2007/0110657 A1 | | 5/2007 | Hunter |
| 2009/0220788 A1 | | 9/2009 | Barrett et al. |
| 2012/0103249 A1 | * | 5/2012 | Gupta .................... C30B 29/36 |
| | | | 117/89 |
| 2012/0114545 A1 | | 5/2012 | Loboda et al. |
| 2013/0243682 A1 | * | 9/2013 | Park ........................ C01B 31/36 |
| | | | 423/346 |

OTHER PUBLICATIONS

Tsutsui et al., Effect of Ambient Pretreatment of Graphite and Solvent-Catalyst on Diamond Formation, Journal of Materials Science, 1987, pp. 1081-1086, vol. 22.

Wang, Measurement of Low Level Nitrogen in Silicon Carbide using SIMS, Materials Science Forum, 2004, pp. 771-774, vols. 457-460.

* cited by examiner

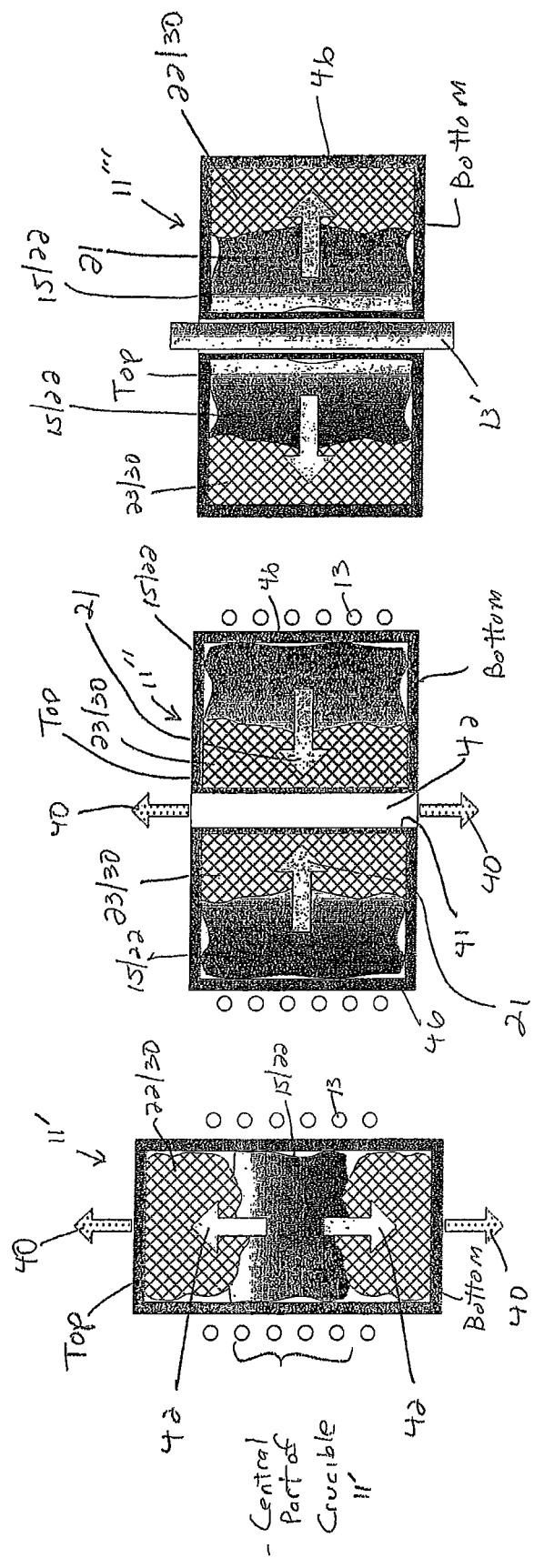

METHOD FOR SYNTHESIZING ULTRAHIGH-PURITY SILICON CARBIDE

CROSS REFERENCE TO RELATED APPLICATIONS

This application is a continuation in part application of U.S. patent application Ser. No. 12/096,306, filed Oct. 15, 2008, entitled "Method for Synthesizing Ultrahigh-Purity Silicon Carbide", which is the national stage of International Application No. PCT/US2006/046673, filed Dec. 7, 2006, which claims the benefit of U.S. Provisional Application No. 60/748,347, filed Dec. 7, 2005, all of which are incorporated herein by reference.

BACKGROUND OF THE INVENTION

1. Field of the Invention

The present invention relates to synthesis of ultrahigh-purity (UHP) polycrystalline silicon carbide (SiC) for the use as a vapor source in industrial-scale growth of high quality SiC single crystals by sublimation.

2. Description of Related Art

Hexagonal 4H and 6H polytypes of silicon carbide possess unique combinations of electronic and thermo-physical properties, which enable operation of semiconductor devices at significantly higher power, frequency and temperature than comparable devices made from conventional silicon. Semi-insulating (SI) 4H SiC and 6H SiC wafers serve as lattice-matched substrates in GaN-based high-electron-mobility transistors (HEMT) operational at microwave frequencies and high power levels. To provide for optimum device performance, the SiC substrate must have the correct resistivity. For microwave devices, the SiC substrate must be semi-insulating with the resistivity on the order of $10^{10}$-$10^{11}$ Ohm-cm. In order to achieve this resistivity, the presence of unwanted residual impurities in the crystal must be minimized.

Commercial-size SiC single crystals are grown by the sublimation technique called Physical Vapor Transport (PVT). In PVT growth, a graphite crucible, typically a cylindrical graphite crucible, is loaded with polycrystalline SiC source material (typically SiC grain) at the bottom, while a SiC single crystal seed wafer (or segment thereof) is disposed at the crucible top, for instance, attached to the crucible lid. The loaded crucible is placed in a gas-tight furnace chamber and, in the presence of an inert atmosphere, is heated to the temperature of SiC sublimation growth, typically, between 2000° C. and 2400° C., with the temperature of the polycrystalline SiC source material being higher by 10-100° C. than the temperature of the SiC single crystal seed. Under these conditions, the SiC source material sublimes and the sublimation vapors migrate, under the influence of temperature difference between the SiC source grain and the SiC single crystal seed, to the SiC single crystal seed where the vapors condense on the SiC single crystal seed causing growth of a SiC single crystal on said SiC single crystal seed. In order to control the growth rate and ensure high crystal quality, PVT growth is carried out under a small pressure of inert gas, generally, between 1 Torr and 100 Torr.

Availability of high-purity SiC source material is important for the growth of SiC single crystals in general, and it is crucial for semi-insulating SiC crystals. In addition to high purity, the SiC source material must be of proper polytype and grain size. For the growth of 6H and 4H SiC single crystals, the desired SiC source material is of "alpha" polytype, that is with crystallites belonging to SiC hexagonal polytypes, such as 4H and/or 6H.

Prior art SiC synthesis includes four basic methods. The methods are:

The Acheson Process

The most widely used large-scale commercial process for production of technical grade SiC is disclosed in U.S. Pat. Nos. 492,767 and 615,648. In this process, a mixture of quartz sand ($SiO_2$) and coke (C) containing various additives is heated up to 3000° C. to form a mass of SiC crystals according to the reaction: $SiO_2 + 3C \Rightarrow SiC + 2CO$. While numerous modifications of the Acheson process have been developed over the years, the produced SiC material always contains high concentrations of boron, nitrogen, aluminum and other metals, and is unsuitable as a source material for the growth of semiconductor-quality SiC crystals.

Chemical Vapor Deposition (CVD)

Bulk SiC shapes with a density close to a theoretical SiC density (3.2 g/cm$^3$) are produced commercially by CVD (see for instance U.S. Pat. No. 5,704,985). In this process, silicon and carbon-containing gaseous precursors react at elevated temperatures, typically, 1200° C. to 1400° C., to form solid SiC. Commonly, SiC is deposited on a suitable substrate such as graphite. A single precursor containing both Si and C atoms, such as Trimethylsilane, can be used as well. Although high-purity precursors are available, commercial-grade bulk SiC produced by CVD is not pure enough for the use as a source in SiC crystal growth, especially for semi-insulating SiC crystals, as such commercial-grade bulk SiC usually contains boron (0.7-2 ppm), metal impurities and nitrogen (up to 100 ppm). In addition, the CVD process yields cubic "beta" polytype of SiC, which is undesirable for crystal growth of 4H and 6H SiC polytypes.

Reactions Between Liquid or Solid Silicon and Carbon Compounds

U.S. Pat. No. 5,863,325 is an example of this approach to SiC synthesis, wherein organic alkoxysilanes and inorganic $SiO_2$ were used as a Si source, while phenolic resin was used as a C source. This type of reaction requires catalysts and other additives, which are undesirable from the standpoint of purity. The produced SiC material contains large concentrations of contaminants and is unsuitable for the growth of semiconductor-quality SiC crystals.

Direct Synthesis of SiC from Elemental Silicon and Carbon

SiC can be formed by direct reaction between its elemental components: $C + Si \Rightarrow SiC$. Elemental silicon and elemental carbon are commercially available in high-purity form. One method of direct synthesis of high purity polycrystalline SiC from elemental Si and C is disclosed in US Patent Application Publication No. 2009/0220788, which is incorporated herein by reference.

US Patent Application Publication No. 2012/0114545 (hereafter "the '545 publication") discloses a two-stage SiC synthesis process wherein, in preparation for synthesis, a mixture of elemental silicon and elemental carbon (i.e., the Si+C charge) is disposed at the bottom of a graphite crucible, while a free space is provided between the Si+C charge at the bottom and the crucible lid situated at the crucible top. The loaded crucible is placed inside a gas-tight furnace chamber which is evacuated and then backfilled with pure inert gas to a pressure of 300 to 600 Torr. In a first stage of the process, the Si+C mixture is heated to a temperature of 1600° C. or higher to react and synthesize the initial SiC charge.

In a second stage of the process, the chamber pressure is reduced to be between 0.05 and 50 Torr, and the system is soaked for 24 to 100 hours. In these conditions, the initial SiC charge sublimes, the vapors condense on the crucible lid thus forming a dense polycrystalline SiC body. The polytype of this SiC body can be controlled by attaching a SiC seed wafer (or segment thereof) of a desired polytype to the crucible lid.

The '545 publication discloses high purity of the final polycrystalline SiC product with respect to P, B, Al, Ti, V and Fe. However, it provides no data on nitrogen content. Attempts at reproducing the process disclosed in the '545 publication yielded polycrystalline SiC containing nitrogen at levels above $1 \cdot 10^{16}$ cm$^{-3}$ and as high as $3 \cdot 10^{17}$ cm$^{-3}$. This high nitrogen content precludes the use of such material as a source in growth of semi-insulating SiC crystals.

SUMMARY OF THE INVENTION

Disclosed herein is a method of producing Ultra High Purity (UHP) polycrystalline silicon carbide having low levels of residual impurities, including nitrogen at levels ≤$8 \times 10^{15}$ atoms/cm$^{-3}$. The method yields bulk polycrystalline grain having SiC particles with diameters in the range between 0.2 and 2 mm, said particles belonging to hexagonal SiC polytypes.

Synthesis of SiC is desirably carried out in a graphite crucible, which is loaded with a reactive mixture of elemental C and elemental Si, and a high purity, light-weight bulk carbon, which is gas- and vapor-permeable (hereinafter "carbon barrier"). The starting elemental Si and elemental C are of high purity, with the purity grade of silicon between 99.99999% and 99.9999999% of Si, and the purity grade of carbon equal to or better than 99.9999% of C. The carbon barrier has a purity equal to or better than 99.9999% of C. Prior to synthesis, all graphite parts of the furnace are halogen-purified, desirably to 20 weight ppm of ash and, more desirably, to 5 weight ppm of ash. The graphite crucible is purified, desirably, to 5 weight ppm of ash and, more desirably, to 1 ppm of ash. Prior to synthesis, residual nitrogen is removed from the growth ambient.

Next, a two-stage SiC synthesis process is performed in the graphite crucible, which is loaded with a reactive mixture of elemental C and elemental Si, and the carbon barrier. In the first stage of the process, direct reaction between the elemental Si and the elemental C of the reactive mixture in the crucible takes place leading to the formation of an as-synthesized SiC charge that includes primarily cubic 3C polytype of SiC, said SiC charge includes traces of residual impurities, including nitrogen. In the second stage of the process, the as-synthesized SiC charge produced in the first stage is purified and converted into high-purity, bulk SiC grain of hexagonal polytype and desired particle size.

The second stage is carried out at temperatures between 2200 and 2400° C., where the cubic 3C polytype of SiC is thermodynamically unstable, while the hexagonal SiC polytypes are stable. The second stage comprises sublimation of the as-synthesized SiC charge and vapor transport across the carbon barrier. During such vapor transport, numerous and repeatable cycles of condensation, reaction and sublimation in the bulk of the carbon barrier take place. Each such cycle includes the following steps: (i) condensation of sublimated SiC vapor on the carbon barrier leading to the formation of SiC deposits on said carbon barrier; (ii) enrichment of the vapor in the crucible with silicon; (iii) reaction between the Si-rich vapor and the carbon of the carbon barrier resulting in the formation of additional solid SiC on the carbon barrier; and (iv) re-sublimation of the SiC deposits formed on the carbon barrier. The net result of the steps (i)-(iv) is nucleation and growth of hexagonal SiC crystallites in the bulk of the carbon barrier combined with deep purification of SiC, including removal of impurities, such as nitrogen.

The end product of the process is bulk polycrystalline SiC grain material that includes SiC particles belonging to hexagonal polytypes with linear particle sizes (diameters) in the range between 0.2 and 2 mm.

The purity of the bulk polycrystalline SiC grain material produced in this manner was characterized using the methods of Glow Discharge Mass Spectroscopy (GDMS) and Secondary Ion Mass Spectroscopy (SIMS). SIMS was performed on larger SiC crystallites (~2 mm in size) recovered from the bulk polycrystalline SiC grain. These larger SiC crystallites included B, Al, Fe and other metal contaminants in concentrations below the detection limit of GDMS, i.e., below 0.01-0.005 weight ppm. SIMS results of these larger SiC crystallites showed the levels of B consistently below $3 \cdot 10^{15}$ atoms/cm$^{-3}$; Al below $1 \cdot 10^{15}$ atoms/cm$^{-3}$; Fe and Ti below $1 \cdot 10^{14}$ atoms/cm$^{-3}$. The levels of background nitrogen in these larger SiC crystallites were below $8 \cdot 10^{15}$ atoms/cm$^{-3}$, which is close to SIMS detection limit for N.

High-purity polycrystalline SiC grain synthesized in the above manner was then used as SiC source material in the growth of vanadium-doped semi-insulating SiC crystals of 6H and 4H polytypes. The grown 6H and 4H polytype crystals exhibited high resistivity—on the order of between $1 \cdot 10^{11}$ and $5 \cdot 10^{11}$ Ohm-cm.

Also disclosed herein is a method of forming polycrystalline SiC material comprising the steps of: (a) positioning a bulk carbon barrier at a first location inside of a graphite crucible, wherein the bulk carbon barrier is gas-permeable and vapor-permeable; (b) positioning a mixture comprised of elemental silicon (Si) and elemental carbon (C) at a second location inside of the graphite crucible; (c) following steps (a) and (b), removing adsorbed gas, or moisture, or volatiles or some combination of adsorbed gas, moisture and volatiles from the mixture and the bulk carbon barrier positioned inside of the graphite crucible by heating the mixture and the bulk carbon barrier positioned inside of the enclosed crucible to a first temperature which is below the melting point of the elemental Si; (d) following step (c), forming as-synthesized silicon carbide (SiC) inside of the crucible by heating the mixture positioned inside of the enclosed crucible to a second temperature sufficient to initiate a reaction between the elemental Si and the elemental C of the mixture that forms the as-synthesized SiC inside of the crucible, wherein during each of steps (c) and (d) a vacuum pump evacuates at least the inside of the enclosed crucible; and (e) following step (d), forming polycrystalline SiC material inside of the bulk carbon barrier by heating the as-synthesized SiC and the bulk carbon barrier in the presence of a temperature gradient sufficient to cause the as-synthesized SiC to sublime and produce vapors that migrate under the influence of the temperature gradient into the bulk carbon barrier where the vapors condense on the bulk carbon barrier and react with the bulk carbon barrier forming the polycrystalline SiC material, wherein a lowest temperature of the temperature gradient is a third temperature.

The mixture can consist essentially of elemental Si and elemental carbon C.

Following steps (a) and (b), part of the mixture can contact part of the bulk carbon barrier inside of the graphite crucible.

The bulk carbon barrier can be at least 99.9999% pure C. The elemental Si can be at least 99.9999% pure Si. The elemental C can be at least 99.9999% pure C. More desirably, the elemental Si can be between 99.99999% and 99.9999999% pure Si and/or the elemental C can be at least 99.99999% pure C.

The elemental Si can be comprised of lumps or granules of polysilicon, with each lump or granule having a maximum linear dimension of (e.g., diameter) between 1 mm and 7 mm. The elemental C can be a carbon powder.

The bulk carbon barrier can be carbon black, carbon beads or pelletized carbon black. The bulk carbon barrier can have a density between 0.3-0.5 g/cm$^3$.

Step (e) can be carried out in the presence of either a vacuum (e.g., <10$^{-4}$ Torr) or a pressure of inert gas between 1 and 50 Torr. The inert gas can be argon.

The first temperature is desirably less than the second temperature, and the second temperature is desirably less than the third temperature.

Step (d) desirably occurs for a period of time sufficient to complete the reaction between the elemental Si and the elemental C.

Step (e) desirably occurs for a period of time sufficient to complete or substantially complete the sublimation of the as-synthesized SiC and the formation of the polycrystalline SiC material inside of the bulk carbon barrier.

The mixture of step (b) desirably has a C:Si atomic ratio between 1:1 and 1.2:1.

The first temperature can be between 1300° C. and 1400° C.; and/or the second temperature can be between 1550° C. and 1800° C.; and/or the third temperature can be between 2200° C. and 2400° C.

The final polycrystalline SiC product can comprise: a mixture of alpha (hexagonal) SiC polytypes; particle sizes between 0.2 and 2 mm; a concentration of nitrogen <8·10$^{15}$ cm$^{-3}$; a concentration of boron <6·10$^{15}$ cm$^{-3}$; a concentration of aluminum below 1·10$^{15}$ cm$^{-3}$; a concentration of iron below 3·10$^{14}$ cm$^3$; and a concentration of titanium below 3·10$^{14}$ cm$^{-3}$.

The method can comprise one or more of the following: step (d) immediately follows step (c); the vacuum in step (c) runs between 10$^{-3}$-10$^{-4}$ Torr near the beginning of step (c) to between 10$^{-5}$-10$^{-6}$ Torr just prior to step (d); step (e) immediately follows step (d); the vacuum in step (d) runs between 10$^{-2}$-10$^{-3}$ Torr near the beginning of step (d) to less than 10$^{-4}$ Torr just prior to step (e); and the vacuum in step (e) is less than 10$^{-4}$ Torr.

Following steps (a) and (b) and prior to step (c), the method can further include the step of: outgassing the mixture and the bulk carbon barrier positioned inside of the graphite crucible via the vacuum pump evacuating at least the inside of the enclosed crucible at ambient temperature.

Also disclosed is a polycrystalline SiC material comprising: a mixture of alpha (hexagonal) SiC polytypes; particle sizes between 0.2 and 2 mm; a concentration of nitrogen <8·10$^{15}$ cm$^{-3}$; a concentration of boron <6·10$^{15}$ cm$^{-3}$; a concentration of aluminum <1·10$^{15}$ cm$^{-3}$; a concentration of iron <3·10$^{14}$ cm$^{-3}$; and a concentration of titanium <3·10$^{14}$ cm$^{-3}$.

BRIEF DESCRIPTION OF THE DRAWINGS

FIGS. 5A-5C show additional embodiments of crucibles for two-stage synthesis of high-purity SiC polycrystalline grain material.

DETAILED DESCRIPTION OF THE INVENTION

Figure 1:
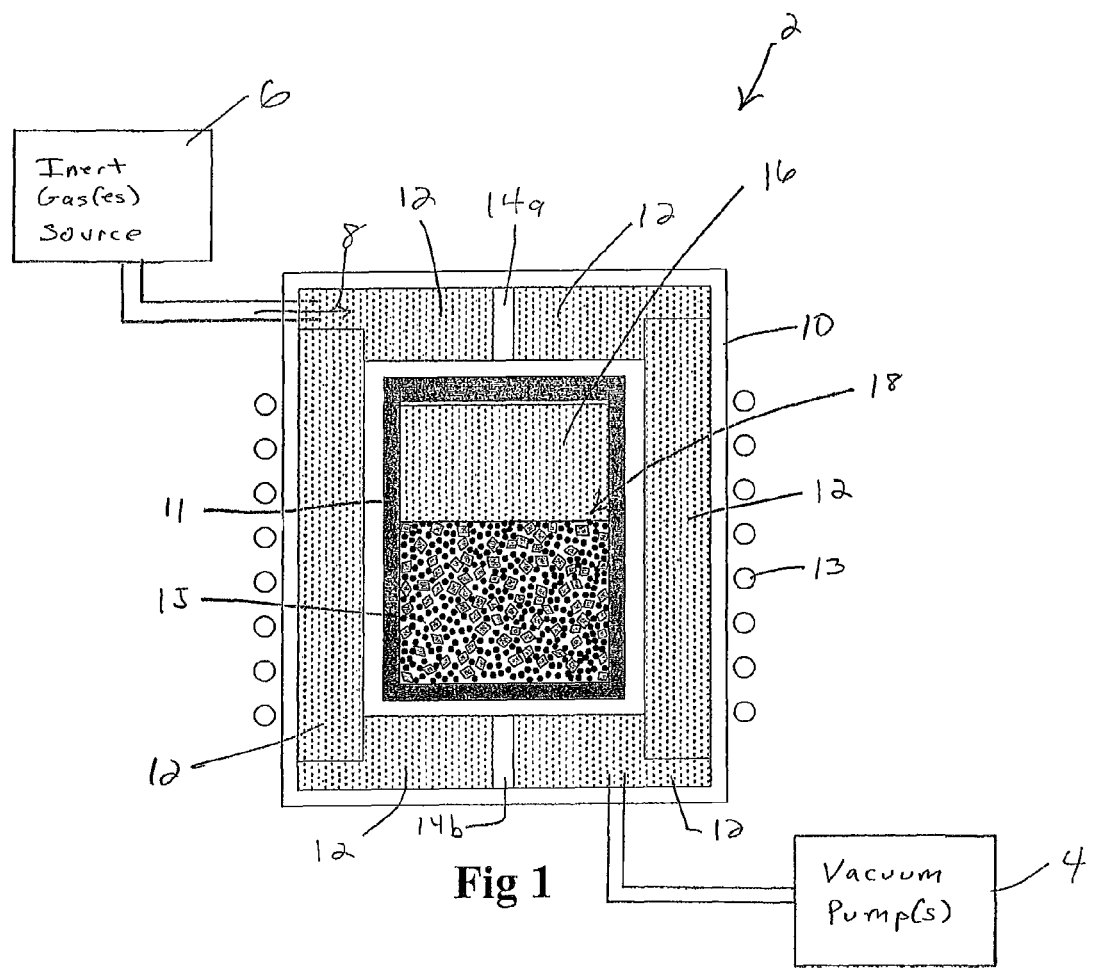
FIG. 1 is a cross-sectional schematic diagram of a cell for two-stage synthesis of high-purity SiC polycrystalline grain material.

FIG. 1 is a cross-sectional, schematic view of a cell 2 for two-stage synthesis of SiC polycrystalline grain material in accordance with the present invention. Cell 2 includes a gas-tight furnace chamber 10 housing a graphite crucible 11 surrounded by thermal insulation 12. A heater 13 is shown schematically as an RF coil, although resistive heating can also or alternatively be used. Windows 14a and 14b in thermal insulation serve for monitoring temperature at the crucible top and bottom using an optical pyrometer. The position of crucible 11 with respect to heater 13 is such that at high temperatures of 1900° C. or higher, a temperature gradient is present, with the temperature of the crucible bottom higher than the temperature of the top of the crucible, desirably, by 50 to 100° C.

Crucible 11 is desirably made from dense, fine-grain, isostatically molded graphite, such as Grade SiC-6, available from Toyo Tanso USA, Inc. of 2575 NW Graham Circle, Troutdale, Oreg. 97060, USA, or similar. The dimensions of crucible 11, without limitation, can be: 100 to 250 mm in outer diameter, 150 to 300 mm tall, and wall thickness between 8 mm and 20 mm. Thermal insulation 12 is, desirably, made of light-weight, fibrous graphite, such as Mersen grade Calcarb-CBCF available from Mersen USA, 900 Harrison St., Bay City, Mich. 48708.

Prior to use, both crucible 11 and thermal insulation 12 are halogen-purified to minimize the presence of background contaminants, such as, without limitation boron, phosphorus and metallic impurities, including aluminum. The purification grade of thermal insulation 12 is, desirably, without limitation, 20 weight ppm of ash, and, more desirably, 5 weight ppm of ash. The purification grade of graphite crucible 11 is, desirably, without limitation, 5 weight ppm of ash, and, more desirably, 1 weight ppm of ash.

Crucible 11 is charged or loaded at the bottom with a reactive mixture 15 consisting substantially of elemental silicon of between 99.99999% and 99.9999999% of Si and elemental carbon of at least 99.9999% of C. The C:Si atomic ratio of mixture 15 is desirably between 1:1 and 1.2:1. That is, compared to a stoichiometric 1:1 composition, the mixture can contain up to 20 atomic % of extra carbon. As used herein, the phrase "consisting substantially of", when utilized in connection with elemental silicon and elemental carbon, means that each of the elemental silicon and elemental carbon have the purity levels described herein and may include trace amounts of one or more elements other than elemental silicon and elemental carbon.

The elemental silicon component of mixture 15 is desirably polysilicon in the form of lumps, shot, granules or particles which are desirably 1 to 7 mm in linear dimension or diameter. The carbon component of mixture 15 is desirably in the form of carbon black, carbon beads or pelletized carbon black. In one non-limiting example, the carbon component is Thermax Ultra-Pure® carbon black available from Cancarb Ltd., 1702 Brier Park Crescent N.W. Medicine Hat, Alberta, Canada, T1C 1T9. Other forms of carbon, such as high-purity graphite powder 5 to 100 micron in diameter, are also acceptable as long as they have the purity described herein.

In FIG. 1, a bulk carbon barrier 16 is loaded in crucible 11 on top of the reactive mixture 15. Desirably, carbon barrier 16 is high-purity carbon black, carbon beads or pelletized carbon black—all having a density between 0.3 and 0.5 g/cm$^3$. The space occupied in crucible 11 by carbon barrier 16 is desirably between 25% and 50% of the total volume of crucible 11. As shown in FIG. 1, a top surface or part of mixture 15 may contact a bottom surface or part of bulk carbon barrier 16 at an interface 18.

Initial Outgassing

In preparation for synthesis of SiC polycrystalline grain material, chamber 10 is loaded with crucible 11, as shown in FIG. 1. Chamber 10 is then sealed and evacuated at room or ambient temperature, e.g., 20-27° C., using one or more conventional vacuum pump(s) 4, such as a roughing pump and/or a turbomolecular pump. Normally, this initial outgassing takes 4 to 8 hours, depending on chamber 10, the graphite forming thermal insulation 12 and crucible 11, the volume of mixture 15, as well as the capacity of vacuum pump(s) 4. At the end of this outgassing, the residual pressure in chamber 10 reaches, desirably, $10^{-5}$-$10^{-6}$ Torr or lower. Since the graphite forming crucible 11 and thermal insulation 12 is/are highly permeable to atmospheric gases, the vacuum produced in chamber 10 by vacuum pump(s) 4 appears almost immediately in the interior of crucible 11.

Heated Outgassing

Figure 2A:
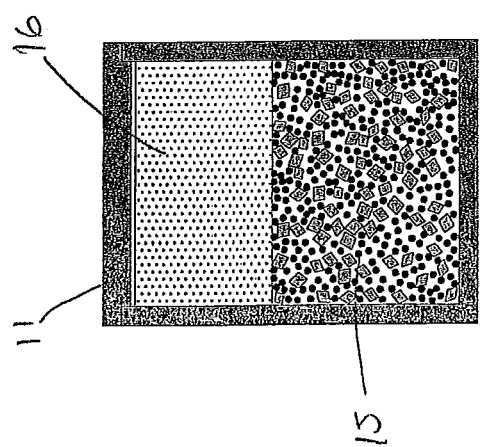
FIGS. 2A-2C are isolated views of the graphite crucible in FIG. 1 at different stages of the two-stage SiC synthesis.

Immediately following initial outgassing at room temperature and without breaking vacuum on chamber 10, heater 13 is energized to bring the temperature of crucible 11 to a level, desirably, between 1300 and 1400° C. This temperature must be below the melting point of silicon (1420° C.), otherwise, premature and unwanted reaction between the elemental silicon and the elemental carbon forming mixture 15 may start. This heated outgassing achieves a deeper removal of residual volatiles and gases (air, moisture, organics) from the graphite parts, such as crucible 11 and thermal insulation 12, as well as from the elemental carbon component of mixture 15 and bulk carbon barrier 16 contained in crucible 11. At the beginning of heated outgassing, the chamber pressure may increase, due to outgassing of components in chamber 10, to between $10^{-3}$-$10^{-4}$ Torr, depending on the size of chamber 10, the amount of graphite in chamber 10 (including the graphite parts, such as crucible 11 and thermal insulation 12, as well as from the carbon component of mixture 15 and bulk carbon barrier 16 contained in crucible 11), the weight of reactive mixture 15 and bulk carbon barrier 16, the capacity of pump(s) 4, and the rate of temperature rise. However, within several hours of heated outgassing, the continuous pumping by pump(s) 4 on chamber 10 should return the pressure in chamber 10 to about $10^{-5}$-$10^{-6}$ Torr or lower. At the above temperature (1300-1400° C.) and under continuous pumping by pump(s) 4, cell 2 is soaked, desirably, for 6 to 24 hours. FIG. 2A illustrates the status of crucible 11 at the end of the heated outgassing step and prior to stage (a) of SiC synthesis described next.

Stage (a) of SiC Synthesis

Immediately following heated outgassing and without breaking vacuum on chamber 10, furnace chamber 10 continues to be under continuous pumping by vacuum pump(s) 4, with the pressure in chamber 10 and, hence, crucible 11 between $10^{-5}$-$10^{-6}$ Torr or lower. Power to heater 13 is controlled to raise the temperature of crucible 11 toward between 2200 and 2400° C. over a period of several hours, desirably, between 4 and 8 hours. As the temperature of crucible 11 passes through between 1550 and 1800° C. on its way to between 2200 and 2400° C., reaction between the elemental silicon and the elemental carbon of reactive mixture 15 starts. The reaction between the elemental silicon and the elemental carbon of reactive mixture 15 is exothermic and the onset of this reaction can be accompanied by an increase in the temperature of crucible 10 and, due to outgassing of components in chamber 10, by an increase in pressure in chamber 10. The pressure in chamber 10 can increase to, without limitation, between $10^{-2}$ and $10^{-3}$ Torr.

Figure 2B:
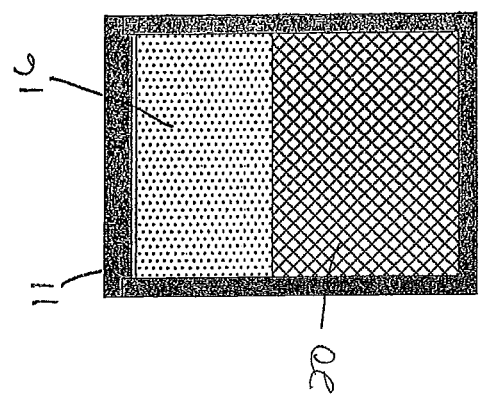

The end of the reaction between the elemental Si and the elemental C of mixture 15 is accompanied by a reduction in the chamber 10 pressure, which normally returns back to, without limitation, $10^{-4}$ Torr or below. Based on observations, it takes 2 to 4 hours to conclude the reaction between the elemental Si and the elemental C of mixture 15, depending on the size of the charge of mixture 15 in crucible 11. The reaction between the elemental Si and the elemental C of mixture 15 yields a dense mass of as-synthesized polycrystalline SiC (hereinafter "as-synthesized SiC charge") comprised substantially of "beta" (cubic) SiC crystallites. The status at the end of phase (a) of the process is illustrated in FIG. 2B, where the as-synthesized SiC charge is shown as item 20.

The purity of the as-synthesized SiC charge 20 was characterized using the methods of Glow Discharge Mass Spectroscopy (GDMS) and Secondary Ion Mass Spectroscopy (SIMS). The as-synthesized SiC charge 20 was observed to include noticeable traces of residual contaminants, such as B, S, Fe and V, at levels on the order of 0.01-0.1 weight ppm. SIMS analysis was performed on larger SiC crystallites (~2 mm in size) recovered from as-synthesized SiC charge 20 and showed nitrogen levels as high as $5 \cdot 10^{17}$ cm$^{-3}$.

Stage (b) of SiC Synthesis

Immediately following stage (a) of SiC synthesis and without breaking vacuum on chamber 10, the heating of crucible 11 by heater 13 continues until crucible 11 reaches temperatures between 2200 and 2400° C., with the temperature at the bottom of crucible 11 being higher, desirably, by 50 to 100° C. than the temperature at the top of crucible 11, i.e., an axial temperature gradient exists in crucible 11. This stage of the process can be carried out either under vacuum, e.g., without limitation, $10^{-5}$-$10^{-6}$ Torr or lower, established by pump(s) 4 or under a small pressure of pure inert gas, e.g., without limitation, between 1 and 50 Torr. In the case of carrying out SiC synthesis under a vacuum, pumping of the chamber 10 by pump(s) 4 continues. In the case of carrying out SiC synthesis under a small pressure of inert gas, inert gas 8, such as argon, is introduced into the furnace chamber 10 from an attached inert gas source (item 6 in FIG. 1) to generate a pressure, desirably, between 1 and 50 Torr in chamber 10 and in crucible 11. The purity of the inert gas 8 with respect to nitrogen is, desirably, 10 ppb or better.

Figure 2C:
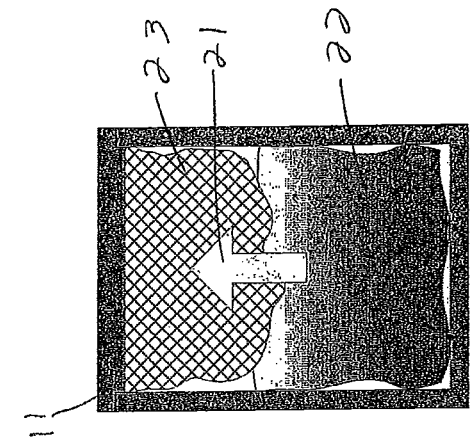

As the temperature of crucible 11 reaches and exceeds 1900° C., substantial sublimation of the as-synthesized SiC charge 20 starts. Driven by the axial temperature gradient, i.e., the temperature gradient between the bottom and the top of crucible 11, the sublimation vapors migrate upward towards the top of crucible 11, as symbolized by arrow 21 in FIG. 2C and permeate into the low-density, gas- and vapor-permeable carbon barrier 16, shown best in FIGS. 2A-2B. The net result of such vapor migration is the formation of high-purity, polycrystalline hexagonal SiC grain in the bulk of the carbon barrier 16. The hexagonal SiC grain formed in the bulk of carbon barrier 16 is symbolized by reference no. 23 in FIG. 2C.

While not wishing to be bound by any particular theory, the following paragraphs elucidate the observed phenomena and mechanism of purification.

It is known in the art of SiC sublimation growth that SiC sublimes incongruently with the Si:C atomic ratio in the vapor phase being substantially higher than 1:1; for instance, as high as 1.5:1. Therefore, upon sublimation of the as-synthesized SiC charge, carbon residue in the form of aggregated graphene sheets is left behind (this carbon residue is shown as item 22 in FIG. 2C).

Figure 3:
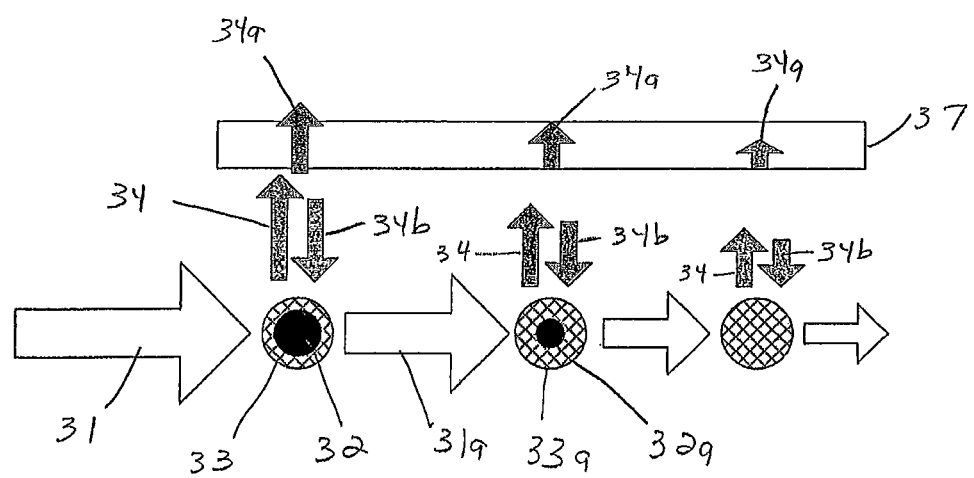
FIG. 3 illustrates elemental steps of vapor condensation, reaction, and sublimation leading to the formation of SiC polycrystalline grain material and the removal of impurities therefrom.

FIG. 3 illustrates elemental processes occurring in the bulk of carbon barrier 16 upon permeation of said barrier 16 by the vapors evolving from the sublimation of the as-synthesized SiC charge 20. These elemental processes include numerous and repeatable steps of vapor condensation, reaction between vapor and carbon, and re-sublimation of the SiC deposit. In FIG. 3, incoming vapor 31 from the sublimation of the as-synthesized SiC charge 20 comes in contact with a carbon particle 32 of carbon barrier 16, condenses on particle 32 and forms SiC deposit 33. As a result of SiC deposition on particle 32, vapor 31 becomes enriched with silicon, which enables vapor 31 to react further with the exposed portion of carbon particle 32 to form additional solid SiC (in other words, to convert carbon particle 32 into SiC). In turn, the SiC deposit 33 sublimes and produces SiC vapor 31a which condenses on another carbon particle 32a in the form of SiC deposit 33a. These elemental steps are repeated multiple times on carbon particles 32, 32a, etc. that form the bulk of carbon barrier 16.

At every elemental cycle of SiC sublimation-reaction-condensation, the mass balance holds for every impurity. Upon sublimation, an impurity contained in the solid SiC (i.e., the carbon particles 32, 32a, etc., that are converted into the solid SiC) is released into the surrounding space in the form of volatile molecular species symbolized by arrow 34. A fraction of the released impurity diffuses across a graphite wall 37 of crucible 11 to the exterior of crucible 11. This diffusion is symbolized by arrow 34a. Upon condensation of vapor 31a on carbon particle 32a, the remaining fraction of the released impurity is absorbed from the surrounding space by the growing SiC deposit. This released impurity absorption is symbolized by arrow 34b.

Hence, the overall degree of impurity removal depends on: (i) chemical affinity of silicon carbide for the impurity; (ii) "transparency" of graphite to the impurity-bearing volatile molecules and (iii) concentration (partial pressure) of impurity in the exterior space.

It is known in the art of SiC sublimation growth that graphite is substantially transparent to gases, such as nitrogen. Therefore, nitrogen released in the process of SiC sublimation described above can be efficiently removed from the interior of graphite crucible 11 by the operation of pump(s) 4 via nitrogen diffusion across the wall 37 of crucible 11, provided that the partial pressure of the nitrogen in furnace chamber 10 is low.

It is also known that transparency of the graphite forming graphite crucible 11 to Si-bearing vapors formed in the process of SiC sublimation described above is substantially poor. Therefore, only minor losses of Si from crucible 11 are incurred in stage (b) of SiC synthesis.

In summary, repeated cycles of condensation-reaction-sublimation take place in the bulk of carbon barrier 16 during SiC vapor transport across said carbon barrier 16 from mixture 15 toward the top of crucible 11 until the final polycrystalline SiC grain material 23 has been prepared. These cycles are accompanied by removal of impurities from the interior of crucible 11, including nitrogen, and nucleation and growth in the bulk of carbon barrier 16 of hexagonal polycrystalline SiC grain material 23 with linear particle dimensions or diameters between 0.2 and 2 mm. The duration of phase (b) of SiC synthesis is desirably between 24 and 72 hours.

The purity of the final polycrystalline SiC grain material 23 was characterized using GDMS and SIMS and was found to include B, Al and other metal contaminants in concentrations below their GDMS detection limits of 0.01-0.005 weight ppm. SIMS analysis was performed on larger crystallites (~2 mm in size) recovered from synthesized batches of polycrystalline SiC grain material 23 and showed the levels of B below $6 \cdot 10^{15}$ atoms/cm$^{-3}$; Al below $1 \cdot 10^{15}$ atoms/cm$^{-3}$; and Fe and Ti below $3 \cdot 10^{14}$ atoms/cm$^{-3}$. The levels of background nitrogen were found to be consistently below $8 \cdot 10^{15}$ atoms/cm$^{-3}$ (close to the lower nitrogen detection limit of SIMS).

Figure 4A:
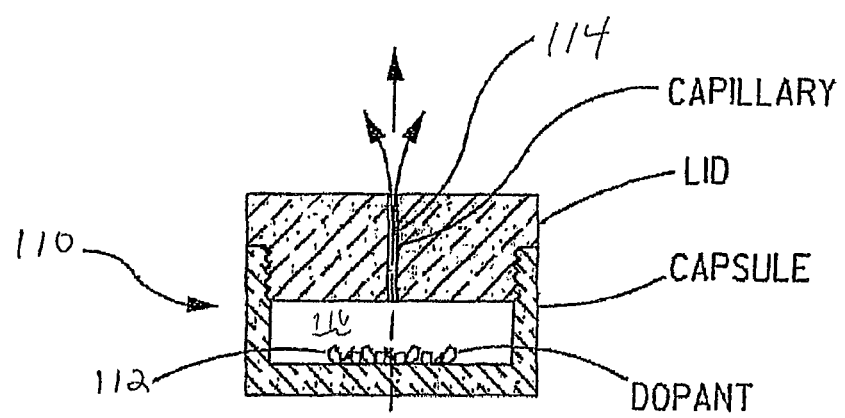
FIG. 4A is a cross-section of a time release capsule for use in the growth of vanadium compensated SiC single crystals.
Figure 4B:
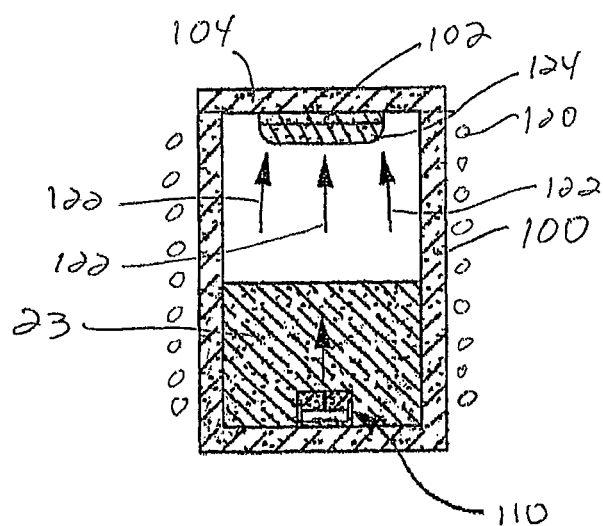
FIG. 4B is a cross-sectional schematic drawing of a growth crucible with the time release capsule of FIG. 4A buried in SiC polycrystalline grain material made in accordance with the steps of FIG. 3, a SiC single seed crystal opposite the SiC polycrystalline grain material and showing the PVT growth of an SiC single crystal on the SiC single crystal seed.

With reference to FIGS. 4A and 4B, polycrystalline SiC grain material 23 synthesized in the manner described above was used as a source in growth by sublimation of vanadium-doped semi-insulating SiC crystals. In preparation for such growth, polycrystalline SiC grain material 23 was loaded on the bottom of a graphite growth crucible 100, while a SiC seed crystal 102 was attached to a lid 104 of the growth crucible 100.

A graphite capsule 110 was prepared and charged with a vanadium dopant 112, in the form of elemental metallic vanadium or a suitable solid vanadium compound. Capsule 110 includes a calibrated capillary 114 of 1 mm in diameter and 3 mm long extending between an interior 116 of capsule 110, where the charge of dopant 112 resides, and an exterior of capsule 110. Capsule 110 with vanadium dopant 112 in interior 116 is placed in growth crucible 100 and buried under polycrystalline SiC grain material 23 at the bottom of crucible 100 (see FIG. 4B).

Growth crucible 100 with vanadium charged capsule 110 buried in polycrystalline SiC grain material 23 was placed into a furnace chamber (like chamber 10 in FIG. 1). The chamber was then evacuated and filled with high-purity argon from an inert gas source (like inert gas source 6 in FIG. 1) to a pressure of 10 Torr. Then, crucible 100 was heated via a heater 120 (like heater 13 in FIG. 1) to a growth temperature, e.g., between 1900° C. and 2400° C., in such a fashion that a vertical temperature gradient was created wherein the temperature of polycrystalline SiC grain material 23 was higher than the temperature of SiC seed crystal 102 by 10 to 50° C.

As is known in the art, at high temperatures, e.g., between 1900° C. and 2400° C., the silicon carbide of the polycrystalline SiC grain material 23 sublimes releasing a spectrum of volatile molecular species of Si, $Si_2C$ and $SiC_2$ to the vapor phase. Driven by the temperature gradient, these species migrate via a vapor flow, represented by arrows 122 in FIG. 4B, to SiC seed crystal 102 and condense on it causing growth of a SiC single crystal 124 on SiC seed crystal 102. Simultaneously, vanadium-bearing molecular species are released from the vanadium dopant 112 in capsule 110 via capillary 114 and are transported with vapor flow 122 to the growing SiC single crystal 124 and absorbed on the growth interface thus causing doping of growing SiC single crystal 124 with vanadium. More details on vanadium doping can be found in U.S. Pat. Nos. 5,611,955; 7,608,524; 8,216,369 and US Patent Application Publication No. 2011/0303884.

The growth of SiC single crystal 124 of 6H polytype and the growth of a separate SiC crystal 124 of 4H polytype containing from $8 \cdot 10^{16}$ atoms/cm$^{-3}$ to $1.2 \cdot 10^{17}$ atoms/cm$^{-3}$ of vanadium, respectively, were determined to be semi-insulating and exhibiting a very high resistivity—between $1 \cdot 10^{11}$ Ohm-cm and $2 \cdot 10^{11}$ Ohm-cm for the 6H polytype SiC single crystal 124 and between $4 \cdot 10^{11}$ Ohm-cm and $5 \cdot 10^{11}$ Ohm-cm for the 4H polytype SiC single crystal 124. A typical purity of the grown SiC single crystals 124, regardless of polytype, with respect to B, Al, Fe and Ti determined by SIMS was $1 \cdot 10^{16}$ atoms/cm$^{-3}$; $5 \cdot 10^{15}$ atoms/cm$^{-3}$; $1 \cdot 10^{15}$ atoms/cm$^{-3}$;

and $5 \cdot 10^{14}$ atoms/cm$^{-3}$, respectively. The nitrogen content in the grown SiC single crystals, regardless of polytype, was below $1 \cdot 10^{16}$ atoms/cm$^{-3}$.

Alternate embodiments (11', 11", and 11''') of crucible 11 are shown in FIGS. 5A-5C, respectively. It is to be appreciated that, in use, each alternate embodiment crucible 11', 11", and 11''' described hereinafter is housed in chamber 10 (FIG. 1) and is surrounded by insulation 12 like crucible 11 in FIG. 1. Chamber 10 and insulation 12 have been omitted from FIGS. 5A-5C and heater 13 is shown in close proximity to each crucible 11' and 11" for simplicity of illustration. Accordingly, the absence of chamber 10 and insulation 12, and the location of heater 13 in close proximity to each crucible 11' and 11" in each of FIGS. 5A-5C is not to be construed as limiting the invention.

In FIG. 5A, which is a cross-sectional view of an embodiment of crucible 11' having a large height-to-diameter aspect ratio, the initial reactive mixture 15 (described above) is placed in the central or middle portion of crucible 11' and is sandwiched between two high-purity, light-weight, bulk carbon barriers 30. The heating geometry is such that heater 13 couples to the central or middle portion of crucible 11'. Due to axial heat losses shown by arrows 40, the top and bottom of crucible 11' are colder than the central part of crucible 11', and vapor transport (shown by arrows 42 in FIG. 5A) is directed towards the top and bottom of crucible 11'. Accordingly, formation of the high-purity polycrystalline SiC grain material 23 takes place in the top and bottom portions of crucible 11', while the carbon residue 22 remains in the central or middle portion of crucible 11'.

In FIG. 5B, which is a cross-sectional view of a crucible 11" having a large diameter-to-height aspect ratio, a tube 41 is disposed substantially coaxially along a central axis of crucible 11". Tube 41 defines an inner cavity 42 which is open to the exterior. At temperatures of SiC synthesis (2200-2400° C.) radiative heat transport dominates. Hence, cavity 42 facilitates heat losses from the central, axial portion of crucible 11" (heat losses from cavity 42 are shown by arrows 40). Inside crucible 11", one or more low-density bulk carbon barriers 30 are placed axi-symmetrically around tube 41, and the reactive mixture 15 is placed outside the bulk carbon barrier(s) 30, i.e., between bulk carbon barrier(s) 30 and an outside wall 46 of crucible 11". This geometry results in radial temperature gradients in an interior of crucible 11". Accordingly, vapor transport (shown by arrows 21) and formation of high-purity polycrystalline SiC grain material 23 takes place around central tube 41, i.e., in bulk carbon barrier(s) 30, while carbon residue 22 forms between bulk carbon barrier(s) 30 and outside wall 46.

In FIG. 5C, which is a cross-sectional view of a crucible 11''' also having a large diameter-to-height aspect ratio, heater 13' is a central heater which is disposed along a central axis of crucible 11'''. The initial reactive mixture 15 is placed in proximity to the heater, while one or more low-density bulk carbon barrier(s) 30 are placed around reactive mixture 15 in the outer area of crucible 11'''. This geometry results in vapor transport being directed outward, towards wall 46 of crucible 11''' (shown by arrows 21), and high-purity polycrystalline SiC grain material 23 forming in the outer area of the crucible interior, i.e., in bulk carbon barrier(s) 30, while carbon residue 22 forms between bulk carbon barrier(s) 30 and heater 13' in FIG. 5C.

The present invention has been described with reference to the preferred embodiments. Obvious modifications and alterations will occur to those of ordinary skill in the art upon reading and understanding the preceding detailed description. It is intended that the invention be construed as including all such modifications and alterations insofar as they come within the scope of the appended claims or the equivalents thereof.

The invention claimed is:

1. A method of forming polycrystalline SiC material comprising the steps of:
    (a) positioning bulk carbon at a first location inside of a graphite crucible, wherein the bulk carbon is gas-permeable and vapor-permeable;
    (b) positioning a mixture comprised of elemental silicon (Si) and elemental carbon (C) at a second location inside of the graphite crucible;
    (c) following steps (a) and (b), removing adsorbed gas, or moisture, or volatiles or some combination of adsorbed gas, moisture and volatiles from the mixture and the bulk carbon positioned inside of the graphite crucible by heating the mixture and the bulk carbon positioned inside of the enclosed crucible to a first temperature which is below the melting point of the elemental Si;
    (d) following step (c), forming as-synthesized silicon carbide (SiC) inside of the crucible by heating the mixture positioned inside of the enclosed crucible to a second temperature sufficient to initiate a reaction between the elemental Si and the elemental C of the mixture that forms the as-synthesized SiC inside of the crucible, wherein during each of steps (c) and (d) a vacuum pump evacuates at least the inside of the enclosed crucible; and
    (e) following step (d), forming polycrystalline SiC material inside of the gas-permeable and vapor-permeable bulk carbon by heating the as-synthesized SiC and the bulk carbon in the presence of a temperature gradient sufficient to cause the as-synthesized SiC to sublime and produce vapors that migrate under the influence of the temperature gradient into the bulk carbon where the vapors condense on the bulk carbon and react with the bulk carbon forming the polycrystalline SiC material, wherein a lowest temperature of the temperature gradient is a third temperature.

2. The method of claim 1, wherein the mixture consists essentially of elemental Si and elemental carbon C.

3. The method of claim 1, wherein following steps (a) and (b), part of the mixture contacts part of the gas-permeable and vapor-permeable bulk carbon inside of the graphite crucible.

4. The method of claim 1, wherein:
    the gas-permeable and vapor-permeable bulk carbon is at least 99.9999% pure C;
    the elemental Si is at least 99.9999% pure Si; and
    the elemental C is at least 99.9999% pure C.

5. The method of claim 1, wherein:
    the gas-permeable and vapor-permeable bulk carbon is at least 99.9999% pure C;
    the elemental Si is at between 99.99999% and 99.9999999% pure Si; and
    the elemental C is at least 99.99999% pure C.

6. The method of claim 1, wherein:
    the elemental Si is comprised of lumps or granules of polysilicon, with each lump or granule having a maximum linear dimension of 1 to 7 mm; and
    the elemental C is a carbon powder.

7. The method of claim 1, wherein:
    the gas-permeable and vapor-permeable bulk carbon is carbon black, carbon beads or pelletized carbon black; and
    the gas-permeable and vapor-permeable bulk carbon has a density between 0.3-0.5 g/cm$^3$.

8. The method of claim 1, wherein step (e) is carried out in the presence of either a vacuum or a pressure of inert gas between 1 and 50 Torr.

9. The method of claim 8, wherein the inert gas is argon.

10. The method of claim 1, wherein the first temperature is less than the second temperature, and the second temperature is less than the third temperature.

11. The method of claim 1, wherein step (d) occurs for a period of time sufficient to complete the reaction between the elemental Si and the elemental C.

12. The method of claim 1, wherein step (e) occurs for a period of time sufficient to substantially complete the sublimation of the as-synthesized SiC and the formation of polycrystalline SiC material inside of the gas-permeable and vapor-permeable bulk carbon.

13. The method of claim 1, wherein the mixture of step (b) has a C:Si atomic ratio between 1:1 and 1.2:1.

14. The method of claim 1, comprising one or more of the following:
the first temperature is between 1300° C. and 1400° C.;
the second temperature is between 1550° C. and 1800° C.; and
the third temperature is between 2200° C. and 2400° C.

15. The method of claim 1, wherein the polycrystalline SiC material comprises:
a mixture of alpha (hexagonal) SiC polytypes;
particle sizes between 0.2 and 2 mm;
a concentration of nitrogen $<8 \cdot 10^{15}$ cm$^{-3}$;
a concentration of boron $<6 \cdot 10^{15}$ cm$^{-3}$;
a concentration of aluminum below $1 \cdot 10^{15}$ cm$^{-3}$;
a concentration of iron below $3 \cdot 10^{14}$ cm$^{-3}$; and
a concentration of titanium below $3 \cdot 10^{14}$ cm$^{-3}$.

16. The method of claim 1, comprising one or more of the following:
step (d) immediately follows step (c);
the vacuum in step (c) runs between $10^{-3}$-$10^{-4}$ Torr near the beginning of step (c) to between $10^{-5}$-$10^{-6}$ Torr just prior to step (d);
step (e) immediately follows step (d);
the vacuum in step (d) runs between $10^{-2}$-$10^{-3}$ Torr near the beginning of step (d) to less than $10^{-4}$ Torr just prior to step (e); and
the vacuum in step (e) is less than $10^{-4}$ Torr.

17. The method of claim 1, wherein following steps (a) and (b) and prior to step (c), the method further including the step of: outgassing the mixture and the gas-permeable and vapor-permeable bulk carbon positioned inside of the graphite crucible via the vacuum pump evacuating at least the inside of the enclosed crucible at ambient temperature.

* * * * *